(12) United States Patent
Yamada et al.

(10) Patent No.: US 10,504,785 B2
(45) Date of Patent: Dec. 10, 2019

(54) SEMICONDUCTOR DEVICE

(71) Applicant: FUJI ELECTRIC CO., LTD., Kawasaki-shi, Kanagawa (JP)

(72) Inventors: Shoji Yamada, Matsumoto (JP); Takashi Shiigi, Matsumoto (JP); Yasuyuki Hoshi, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/989,337

(22) Filed: May 25, 2018

(65) Prior Publication Data

US 2018/0277437 A1    Sep. 27, 2018

Related U.S. Application Data

(63) Continuation of application No. PCT/JP2017/017427, filed on May 8, 2017.

(30) Foreign Application Priority Data

Jun. 3, 2016   (JP) .................................. 2016-111759

(51) Int. Cl.
   *H01L 27/06* (2006.01)
   *H01L 29/78* (2006.01)
   (Continued)

(52) U.S. Cl.
   CPC .......... *H01L 21/8234* (2013.01); *H01L 27/06* (2013.01); *H01L 27/0629* (2013.01);
   (Continued)

(58) Field of Classification Search
   CPC combination set(s) only.
   See application file for complete search history.

(56) References Cited

U.S. PATENT DOCUMENTS

| | | | | |
|---|---|---|---|---|
| 5,726,481 A * | 3/1998 | Moody | ............... | H01L 27/0248 257/467 |
| 2005/0012143 A1* | 1/2005 | Tanaka | ................ | H01L 29/4966 257/328 |
| 2009/0230500 A1* | 9/2009 | Yoshikawa | ......... | H01L 27/0255 257/470 |

FOREIGN PATENT DOCUMENTS

| | | |
|---|---|---|
| JP | H07-153920 A | 6/1995 |
| JP | 2005-175357 A | 6/2005 |

(Continued)

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.

(Continued)

*Primary Examiner* — Hoang-Quan T Ho
*Assistant Examiner* — Jordan M Klein
(74) *Attorney, Agent, or Firm* — Rabin & Berdo, P.C.

(57) ABSTRACT

A main semiconductor element and a temperature sensing part are arranged on a single silicon carbide base. The main semiconductor element is a vertical MOSFET and the temperature sensing part is a horizontal diode. An anode region of the temperature sensing part and an $n^+$-type source region and a $p^+$-type contact region of the main semiconductor element are connected by wiring by an anode electrode on a front surface of the silicon carbide base. The temperature sensing part, when the main semiconductor element is ON, is forward biased by drift current flowing in the main semiconductor element. The temperature sensing part, for example, is a poly-silicon diode constituted by a p-type poly-silicon layer and an n-type poly-silicon layer arranged on the front surface of the silicon carbide base. With such configuration, a semiconductor device having high reliability may be provided.

8 Claims, 10 Drawing Sheets

(51) Int. Cl.

| | | |
|---|---|---|
| *H01L 21/8234* | (2006.01) | |
| *H01L 29/06* | (2006.01) | |
| *H01L 29/16* | (2006.01) | |
| *H01L 29/66* | (2006.01) | |
| *H01L 29/10* | (2006.01) | |
| *H01L 29/861* | (2006.01) | |

(52) U.S. Cl.
CPC .......... *H01L 29/06* (2013.01); *H01L 29/1095* (2013.01); *H01L 29/1608* (2013.01); *H01L 29/66068* (2013.01); *H01L 29/7804* (2013.01); *H01L 29/7813* (2013.01); *H01L 29/7827* (2013.01); *H01L 29/16* (2013.01); *H01L 29/861* (2013.01); *H01L 29/8611* (2013.01)

(56) References Cited

FOREIGN PATENT DOCUMENTS

| JP | 2009-188335 A | 8/2009 |
|---|---|---|
| JP | 2013-098316 A | 5/2013 |
| JP | 2013-105932 A | 5/2013 |
| JP | 2013-201357 A | 10/2013 |

OTHER PUBLICATIONS

B. Jayant Baliga, "Silicon Carbide Power Devices", USA, World Scientific Publishing Co., pp. 60-69, Mar. 30, 2006.

\* cited by examiner

SEMICONDUCTOR DEVICE

CROSS REFERENCE TO RELATED APPLICATIONS

This is a continuation application of International Application PCT/JP2017/017427 filed on May 8, 2017 which claims priority from a Japanese Patent Application No. 2016-111759 filed on Jun. 3, 2016, the contents of which are incorporated herein by reference.

BACKGROUND OF THE INVENTION

1. Field of the Invention

Embodiments of the invention relate to a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. Therefore, in terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, wide bandgap semiconductor material), such as gallium nitride (GaN). Thus, a high-voltage semiconductor device can be achieved by using a wide bandgap semiconductor material (see, for example, B. Jayant Baliga, "Silicon Carbide Power Devices", USA, World Scientific Publishing Co., 2006.03.30, p. 61).

For such a high-voltage semiconductor device using silicon carbide, for example, when used in an inverter, the extent to which loss occurs is reduced, and the high-voltage semiconductor device may be used for carrier frequency applications 10 times higher than that of a conventional semiconductor device using silicon. When the high-voltage semiconductor device is used for a high carrier frequency application, the temperature of the heat generated by a semiconductor chip constituting the high-voltage semiconductor device increases and adversely affects the reliability of the semiconductor device. In other words, in a semiconductor device (hereinafter, silicon carbide semiconductor device) containing silicon carbide, since there is an upper limit for an operating temperature of a semiconductor element, a structure for monitoring the operating temperature of the semiconductor element is provided.

As a structure for monitoring the temperature of a semiconductor element, a structure has been proposed in which a diode constituting a temperature sensing part that detects the temperature of a semiconductor element is arranged on a same semiconductor substrate as the semiconductor element (for example, refer to Japanese Laid-Open Patent Publication No. 2013-098316, Japanese Laid-Open Patent Publication No. 2005-175357).

SUMMARY OF THE INVENTION

According to an embodiment of the present invention, a semiconductor device includes a semiconductor element having: a first semiconductor layer of a first conductivity type, the first semiconductor layer being a portion of a front surface side of a semiconductor substrate of the first conductivity type; a first semiconductor region of a second conductivity type provided selectively in the first semiconductor layer; a second semiconductor region of the first conductivity type provided selectively in the first semiconductor region; a gate insulating film provided in contact with a region of the first semiconductor region between the first semiconductor layer and the second semiconductor region; a gate electrode provided opposing the first semiconductor region, across the gate insulating film; a first electrode layer in contact with the first semiconductor region and the second semiconductor region; a second semiconductor layer of the first conductivity type, the second semiconductor layer being a portion of a rear side of the semiconductor substrate, in contact with the first semiconductor layer, the second semiconductor layer having an impurity concentration that is higher than an impurity concentration of the first semiconductor layer; and a second electrode layer in contact with the second semiconductor layer; and the semiconductor device further including a diode arranged in the semiconductor substrate, the diode detecting a temperature of the semiconductor element. The diode has an anode region electrically connected to the first semiconductor region and the second semiconductor region, via a third electrode layer arranged on a front surface of the semiconductor substrate.

In the embodiment, the diode has: a poly-silicon layer of the second conductivity type provided on the front surface of the semiconductor substrate, the poly-silicon layer constituting the anode region; a poly-silicon layer of the first conductivity type provided on the front surface of the semiconductor substrate, in contact with the poly-silicon layer of the second conductivity type; the third electrode layer in contact with the first semiconductor region, the second semiconductor region, and the poly-silicon layer of the second conductivity type; and a fourth electrode layer in contact with the poly-silicon layer of the first conductivity type.

In the embodiment, the diode has: a third semiconductor region of the second conductivity type provided selectively in the first semiconductor layer; a fourth semiconductor region of the second conductivity type provided selectively in the third semiconductor region and constituting the anode region, the fourth semiconductor region having an impurity concentration that is higher than an impurity concentration of the third semiconductor region; a fifth semiconductor region of the first conductivity type provided selectively in the third semiconductor region; the third electrode layer in contact with the first semiconductor region, the second semiconductor region, and the fourth semiconductor region; and a fourth electrode layer in contact with the fifth semiconductor region.

In the embodiment, the semiconductor device further includes a sixth semiconductor region of the first conductivity type provided between the third semiconductor region and, the fourth semiconductor region and the fifth semiconductor region. The sixth semiconductor region has an impurity concentration that is lower than an impurity concentration of the fifth semiconductor region. The third semiconductor region is fixed at a same potential as that of the first electrode layer.

In the embodiment, the sixth semiconductor region, the third semiconductor region and the first semiconductor layer constitute a parasitic npn bipolar transistor voltage driven by a voltage applied between the first electrode layer and the second electrode layer of the semiconductor element.

In the embodiment, the diode is voltage driven by a gate threshold voltage of the semiconductor element.

In the embodiment, the semiconductor substrate contains a semiconductor material having a bandgap wider than a bandgap of silicon.

In the embodiment, the semiconductor material having a bandgap wider than a bandgap of silicon is silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
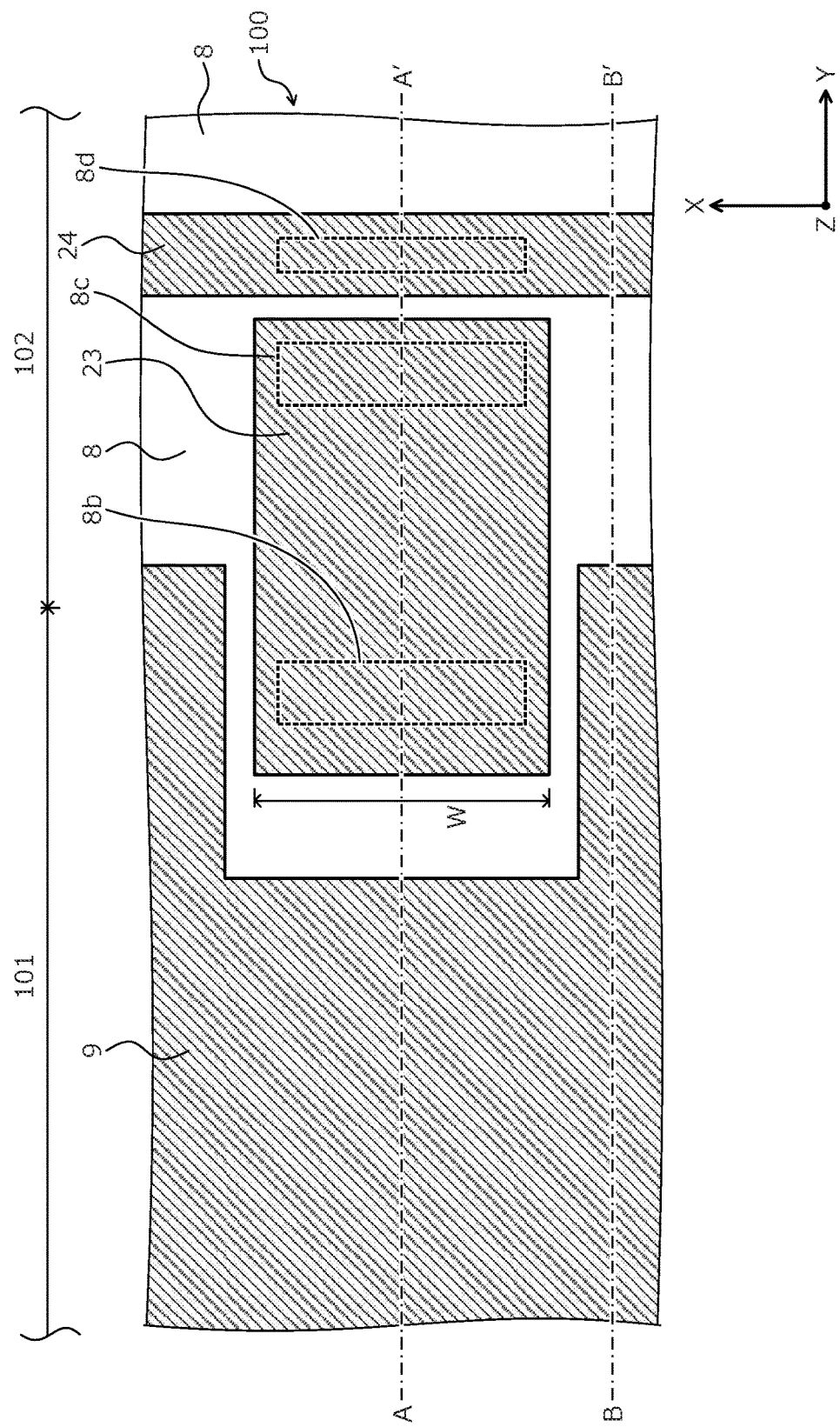
FIG. 1 is a plan view of an example of a planar layout of a semiconductor device according to a first embodiment.

First, problems associated with the related arts will be described. In Japanese Laid-Open Patent Publication No. 2013-098316 and Japanese Laid-Open Patent Publication No. 2005-175357, an external current source for energizing the diode constituting the temperature sensing part is necessary. Therefore, a problem arises in that the number of external components increases and reliability of the semiconductor device as a product decreases.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to an embodiment of the present invention contains a wide bandgap semiconductor material. In a first embodiment, a silicon carbide semiconductor device fabricated using, for example, silicon carbide (SiC) as the wide bandgap semiconductor material will be described. FIG. 1 is a plan view of an example of a planar layout of the semiconductor device according to a first embodiment. FIG. 1 depicts a part near a border of an active region 101 and an edge termination region 102 (similarly in FIG. 6). The active region 101 is a region through which current flows in an ON state. The edge termination region 102 is a region that is arranged surrounding a perimeter of the active region and that mitigates electric field at a base front surface side of a drift region and sustains breakdown voltage.

Figure 2:
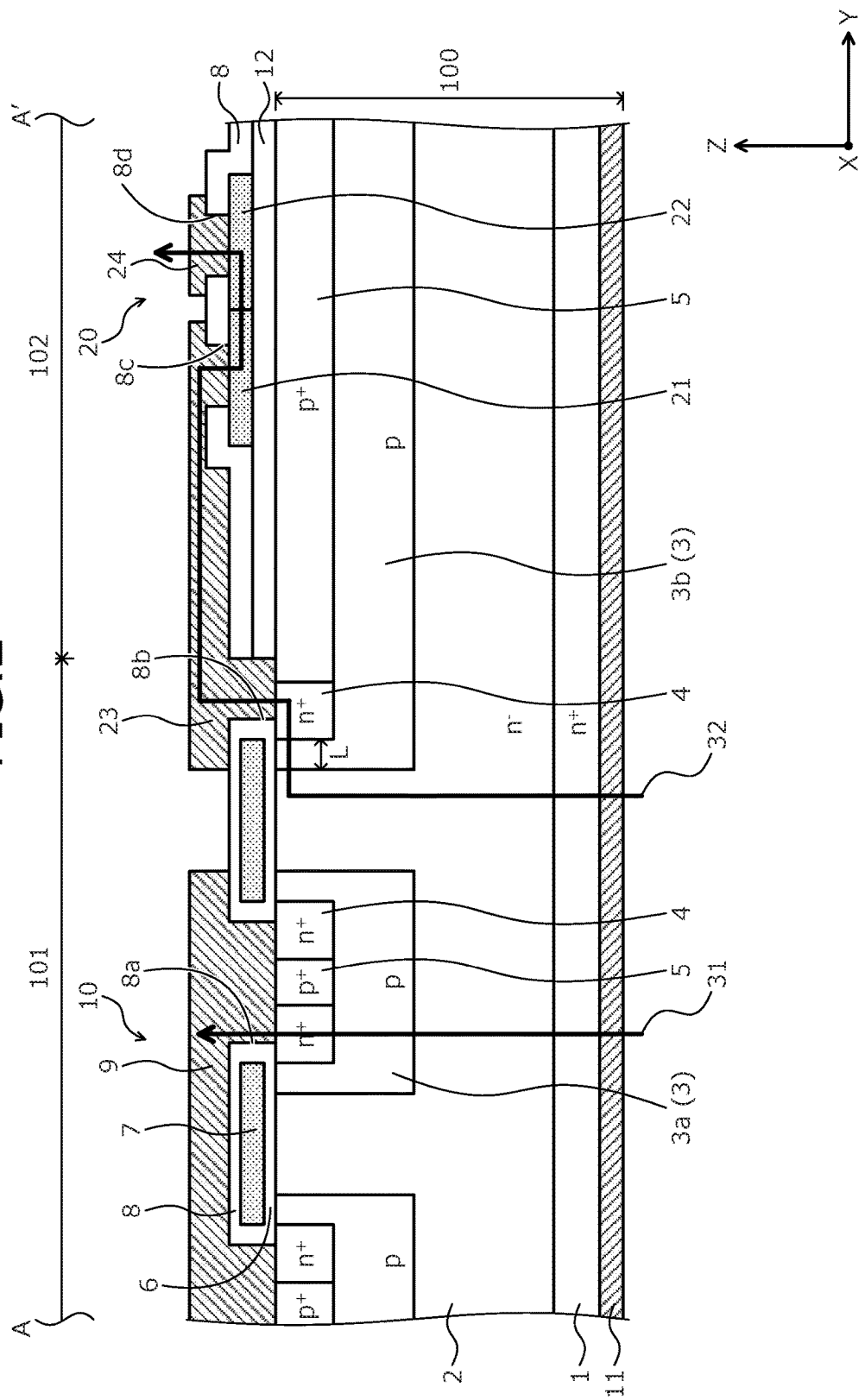
FIG. 2 is a cross-sectional view at cutting line A-A' in FIG. 1.
Figure 3:
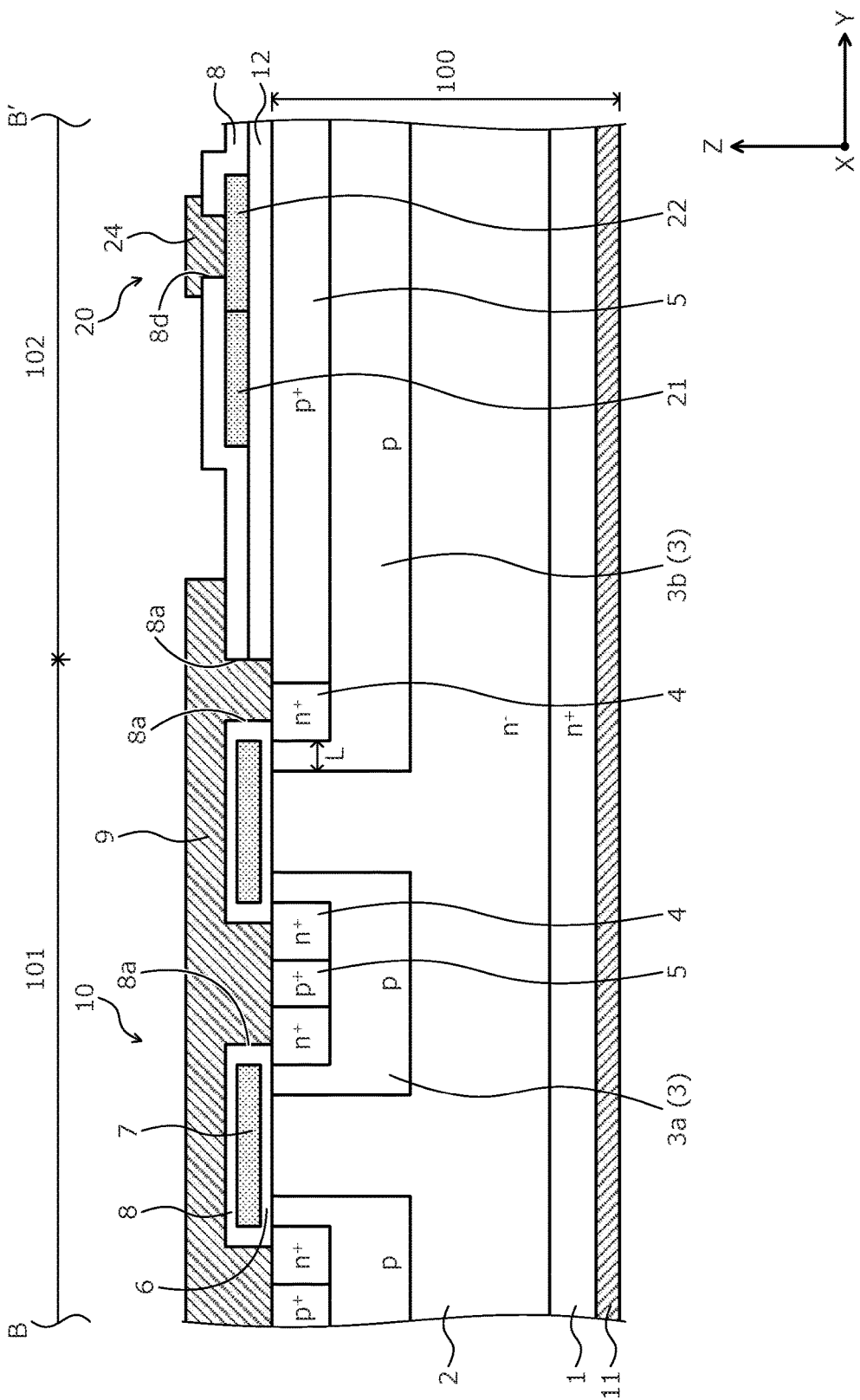
FIG. 3 is a cross-sectional view at cutting line B-B' in FIG. 1.

As depicted in FIG. 1, the semiconductor device according to the first embodiment has a main semiconductor element 10 described hereinafter and a temperature sensing part 20 (refer to FIGS. 2, 3) provided on a single semiconductor base (hereinafter, silicon carbide base (semiconductor substrate (semiconductor chip))) 100 that contains silicon carbide. The main semiconductor element 10 is a vertical MOSFET through which drift current flows in a vertical direction (a depth direction Z of the silicon carbide base 100) in an ON state. The main semiconductor element 10 is configured by plural (e.g., about a few hundred to a few tens of thousands) unit cells (functional units) that are arranged adjacently in the active region 101 and performs a main operation. In FIGS. 2 and 3, a portion of the unit cells among the unit cells of the main semiconductor element 10 are depicted (similarly in FIGS. 4, 5, 7 to 10).

The temperature sensing part 20 is a circuit part for protecting the main semiconductor element 10 and has a function of detecting a temperature of the main semiconductor element 10 by using temperature characteristics of a diode. Although not depicted, in the silicon carbide base 100, further circuit parts may be arranged for protecting and controlling the main semiconductor element 10. Other circuit parts for protecting and controlling the main semiconductor element 10 include, for example, a non-depicted overvoltage protecting part, current sensing part and computing circuit part. The overvoltage protecting part, for example, is a diode that protects the main semiconductor element 10 from overvoltage such as surges.

The current sensing part is a vertical MOSFET that detects current flowing in the main semiconductor element 10. The computing circuit part controls the temperature sensing part 20, the current sensing part and the overvoltage protecting part, and based on output signals from these parts, further controls the main semiconductor element 10. Electrode pads (source pad, gate pad) of the main semiconductor element 10 and electrode pads of the circuit parts protecting and controlling the main semiconductor element 10 are arranged on the silicon carbide base 100 in a predetermined planar layout, and are electrically insulated from each other by an interlayer insulating film 8. The planar layouts and the planar shapes of electrode pads may be variously changed.

For example, a source electrode (first electrode layer) 9 constituting the source pad of the main semiconductor element 10 is arranged so as to cover an entire surface of the active region 101. The source electrode 9 opposes, in the depth direction Z, substantially all of the unit cells configuring the main semiconductor element 10. An anode electrode (third electrode layer) 23 and a cathode electrode (fourth electrode layer) 24 constituting the electrode pad (anode pad and cathode pad) of the temperature sensing part 20 may be arranged in a region of the active region 101 or a region of the edge termination region 102. The anode electrode 23 opposes, in the depth direction Z, some of the unit cells constituting the main semiconductor element 10.

In FIG. 1, a case is depicted in which the anode electrode 23 is arranged near the border of the active region 101 and the edge termination region 102. In this case, the source electrode 9 may have a planar shape in which, for example, a portion opposing the anode electrode 23 is recessed along a direction (hereinafter, first direction) X parallel to the base front surface, or along a direction (hereinafter, second direction) Y orthogonal to the first direction X. The anode electrode 23 may be arranged to be in the recess of the source electrode 9 and may be connected to a portion of the unit cells constituting the main semiconductor element 10. The cathode electrode 24 may be arranged further outward (closer to a chip edge) than is the anode electrode 23.

Although not depicted, a first contact hole 8a forming a contact (electrical contact part) of the source electrode 9 and the silicon carbide base 100, for example, is arranged in substantially a same planar layout as that of a $n^+$-type source region and a $p^+$-type contact region of a unit cell constituting the main semiconductor element 10. Reference characters 8b and 8c represent examples of planar layouts of the first and the second contact holes forming contacts with the anode electrode 23. Reference character 8d represents an example of a planar layout of a fourth contact hole forming a contact with the cathode electrode 24.

A cross-section structure of the semiconductor device according to the first embodiment will be described taking, as an example, a case in which the main semiconductor element 10 is a vertical MOSFET having planar-gate structure. FIG. 2 is a cross-sectional view at cutting line A-A' in FIG. 1. FIG. 3 is a cross-sectional view at cutting line B-B' in FIG. 1. The main semiconductor element 10 includes, in the active region 101, at the front surface side of the silicon carbide base 100, a MOS gate structure part constituted by a p-type base region (first semiconductor region) 3, an $n^+$-type source region (second semiconductor region) 4, a $p^+$-type contact region 5, a gate insulating film 6, and a gate electrode 7. One MOS gate structure part constitutes one unit cell.

The silicon carbide base 100 is formed by stacking an $n^-$-type semiconductor layer (hereinafter, $n^-$-type silicon carbide layer (first semiconductor layer)) 2 containing silicon carbide, on a front surface of an $n^+$-type supporting substrate (hereinafter, $n^+$-type silicon carbide substrate (second semiconductor layer)) 1 containing silicon carbide. The $n^+$-type silicon carbide substrate 1 functions as a drain region of the main semiconductor element 10. The p-type base region 3 is selectively provided in a surface layer on a first side (base front surface side) of the $n^-$-type silicon carbide layer 2, opposite a second side of the $n^-$-type silicon carbide layer 2 opposing the $n^+$-type silicon carbide substrate 1. A portion of the $n^-$-type silicon carbide layer 2 other than the p-type base region 3 is the drift region. A portion of the drift region between adjacent p-type base regions 3 is an n-type junction FET (JFET).

The $n^+$-type source region 4 and the $p^+$-type contact region 5 are each selectively provided in the p-type base region 3. The $n^+$-type source region 4 is arranged closer to the gate electrode 7 than is the $p^+$-type contact region 5. Of the p-type base regions 3 constituting the unit cells, an outermost p-type base region 3b that is arranged nearest the edge termination region 102 extends outwardly from the active region 101 to a position opposing the temperature sensing part 20 described hereinafter, in the depth direction Z. Reference character 3a represents one of the p-type base regions 3 other than the outermost p-type base region 3b. In the outermost p-type base region 3b, the $p^+$-type contact region 5 is arranged further outward than is the $n^+$-type source region 4 and extends from the active region 101 into the edge termination region 102.

The p-type base region 3, the $n^+$-type source region 4, the $p^+$-type contact region 5 and the n-type JFET region, for example, may be arranged in a striped planar layout extending in the first direction X. Further, the p-type base region 3, for example, may be arranged in a matrix-like planar layout. In this case, for example, the $p^+$-type contact region 5 is arranged near a central part of the p-type base region 3; and the $n^+$-type source region 4 is arranged in a planar layout surrounding a periphery of the $p^+$-type contact region 5. The n-type JFET region is arranged in a grid-like planar layout passing between adjacent p-type base regions 3.

Further, the silicon carbide base 100 may be constituted by the $n^+$-type silicon carbide substrate 1, the $n^-$-type silicon carbide layer 2, and a p-type semiconductor layer (hereinafter, p-type silicon carbide layer) containing silicon carbide, respectively stacked in order stated. In this case, in the p-type silicon carbide layer being a surface layer of the silicon carbide base 100, the $n^+$-type source region 4 and the $p^+$-type contact region 5 are arranged. Additionally, the n-type JFET region is arranged penetrating the p-type silicon carbide layer in the depth direction Z and is in contact with the drift region. A portion of the p-type silicon carbide layer other than the $n^+$-type source region 4, the $p^+$-type contact region 5, and the n-type JFET region is the p-type base region 3.

On a surface of a portion of the p-type base region 3 between the $n^+$-type source region 4 and the drift region (the $n^-$-type silicon carbide layer 2 or the n-type JFET region), the gate electrode 7 is provided via the gate insulating film 6. On the surface of the drift region constituting the same unit cell, the gate insulating film 6 may be extended and the gate electrode 7 may be provided so as to oppose the drift region in the depth direction Z across the gate insulating film 6. The interlayer insulating film 8 is provided on the front surface of the silicon carbide base 100 overall so as to cover the gate electrode 7. The $n^+$-type source region 4 and the $p^+$-type contact region 5 are exposed at the first and the second contact holes 8a, 8b opened in the interlayer insulating film 8.

The source electrode 9 is in contact with the $n^+$-type source region 4 and the $p^+$-type contact region 5 via the first contact hole 8a and is electrically insulated from the gate electrode 7 by the interlayer insulating film 8 (FIGS. 2, 3). The source electrode 9, at a location in contact with the n$^+$-type source region 4 and the p$^+$-type contact region 5 in the outermost p-type base region 3b, may extend on the outer interlayer insulating film 8 (FIG. 3). The gate electrodes 7 of all unit cells constituting the main semiconductor element 10 are electrically connected to a gate pad (non-depicted electrode pad). At a rear surface (rear surface of the n$^+$-type silicon carbide substrate 1) of the silicon carbide base 100 overall, a drain electrode (second electrode layer) 11 is provided.

In the edge termination region 102, the front surface of the silicon carbide base 100 is covered by an insulating layer 12. On the insulating layer 12, a p-type poly-silicon layer 21 and an n-type poly-silicon layer 22 are selectively provided. The p-type poly-silicon layer 21 and the n-type poly-silicon layer 22 oppose, in the depth direction Z, the outermost p-type base region 3b or the p$^+$-type contact region 5 therein, across the insulating layer 12. A horizontal diode (poly-silicon diode) constituting the temperature sensing part 20 is configured by a pn junction between the p-type poly-silicon layer 21 and the n-type poly-silicon layer 22. In other words, the p-type poly-silicon layer 21 and the n-type poly-silicon layer 22 are respectively an anode region and a cathode region of the temperature sensing part 20.

The insulating layer 12 and the gate insulating film 6 may have a same thickness. Further, although the temperature sensing part 20 may be arranged directly on the p$^+$-type contact region 5 in the outermost p-type base region 3b without provision of the insulating layer 12, problems such as the poly-silicon layer peeling from the silicon carbide base 100 may occur. Further, leak current from the silicon carbide base 100 to the temperature sensing part 20 may occur. Therefore, with consideration of greater reliability, the temperature sensing part 20 may be arranged on the front surface of the silicon carbide base 100 via the insulating layer 12 that is thick. The p-type poly-silicon layer 21 and the n-type poly-silicon layer 22 are covered by the interlayer insulating film 8 and a part of each is exposed at the third and the fourth contact holes 8c, 8d opened in the interlayer insulating film 8.

The anode electrode 23 is in contact with the p-type poly-silicon layer 21 via the third contact hole 8c. The anode electrode 23 is in contact with at least a part of the p-type poly-silicon layer 21 and a planar shape of the third contact hole 8c may be variously changed. Further, the anode electrode 23, via the second contact hole 8b, is in contact with the n$^+$-type source region 4 and the p$^+$-type contact region 5 of at least one unit cell configuring the main semiconductor element 10. FIG. 2 depicts a case in which the anode electrode 23 is in contact with the n$^+$-type source region 4 and the p$^+$-type contact region 5 in the outermost p-type base region 3b (similarly in FIG. 4).

In other words, the anode region of the temperature sensing part 20 and, the n$^+$-type source region 4 and the p$^+$-type contact region 5 of the main semiconductor element 10 are connected to the anode electrode 23 by wiring. The anode electrode 23 is in contact with at least a part of the n$^+$-type source region 4 and a part of the p$^+$-type contact region 5 of a unit cell constituting the main semiconductor element 10 and the planar shape of the second contact hole 8b may be variously changed. The cathode electrode 24 is in contact with the n-type poly-silicon layer 22 via the fourth contact hole 8d. The cathode electrode 24 may be in contact with an entire surface of the n-type poly-silicon layer 22 or a portion of the n-type poly-silicon layer 22.

As described, the anode region (the p-type poly-silicon layer 21) of the temperature sensing part 20 is electrically connected to the n$^+$-type source region 4 and the p$^+$-type contact region 5 of the main semiconductor element 10, whereby when the main semiconductor element 10 is ON, the temperature sensing part 20 is forward biased and energized. In particular, when positive voltage with respect to the source electrode 9 of the main semiconductor element 10 is applied to the drain electrode 11 and voltage equal to or higher than a gate threshold voltage is applied to the gate electrode 7, a portion (surface region opposing the gate electrode 7 in the depth direction Z, across the gate insulating film 6) of the p-type base region 3 directly under the gate electrode 7 forms an n-type inversion layer (channel).

Due to the formation of the channel in the surface region of the p-type base region 3, a current (drift current) 31 flows along a path of the n$^+$-type silicon carbide substrate 1, the n$^-$-type silicon carbide layer 2, the surface region of the p-type base region 3 and the n$^+$-type source region 4, turning ON the main semiconductor element 10. At this time, since the anode electrode 23 is connected to the n$^+$-type source region 4 of the main semiconductor element 10, from the n$^+$-type source region 4, a current 32 further flows along a path of the anode electrode 23, the p-type poly-silicon layer 21, the n-type poly-silicon layer 22 and the cathode electrode 24. The current 32 is forward current (drift current) of the temperature sensing part 20. In other words, the temperature sensing part 20 is voltage driven by the gate threshold voltage of the main semiconductor element 10.

On the other hand, when a voltage lower than the threshold voltage is applied to the gate electrode 7, a pn junction between the p-type base region 3 and the drift region (the n$^-$-type silicon carbide layer 2) becomes reverse biased. Therefore, the current 31 does not flow in the main semiconductor element 10. The current 32 does not flow in the temperature sensing part 20 either. In other words, the main semiconductor element 10 maintains the OFF state and the temperature sensing part 20 is reversed biased and is not energized. In this manner, the gate threshold voltage of the main semiconductor element 10 is controlled, whereby the turning ON and OFF of the temperature sensing part 20 may be linked to the turning ON and OFF (switching operation) of the main semiconductor element 10.

Current capability of the temperature sensing part 20 is determined by current capability of a portion of a unit cell of the main semiconductor element 10, the portion opposing the anode electrode 23 in the depth direction Z. In other words, the current capability of the temperature sensing part 20 is determined by adjusting according to design conditions, the number of unit cells of the main semiconductor element 10 connected to the anode electrode 23 and a size of the anode electrode 23 (for example, refer to a width W of the anode electrode 23 along the first direction X in FIG. 1). FIGS. 1 to 3 depict a case in which the anode electrode 23 is connected to one unit cell (the unit cell constituted by the outermost p-type base region 3b) of the main semiconductor element 10.

For example, in a case in which the unit cells of the main semiconductor element 10 are arranged in a striped planar layout extending along the first direction X, the anode electrode 23 is connected to two unit cells of the main semiconductor element 10. In this case, the anode electrode 23 is connected to the unit cell constituted by the outermost p-type base region 3b. In addition, the anode electrode 23 is connected to one more unit cell that is constituted by the p-type base region 3a adjacent to the outermost p-type base region 3b along the second direction Y, inwardly (toward a chip center). The current capability of the temperature sensing part 20, for example, may be about 1/1000 to 1/10 of the current capability of the main semiconductor element 10.

A method of manufacturing the semiconductor device according to the first embodiment will be described taking, as an example, a case in which the main semiconductor element 10 having a 1200V breakdown voltage is fabricated. First, the n$^+$-type silicon carbide substrate (semiconductor wafer) 1 is prepared. The n$^+$-type silicon carbide substrate 1 may be, for example, a silicon carbide single-crystal substrate doped with an n-type impurity (dopant) such as nitrogen (N) so that an impurity concentration thereof becomes $2.0\times10^{19}/cm^3$. The front surface of the n$^+$-type silicon carbide substrate 1 may be, for example, a (000-1) plane having an off angle of 4 degrees in a <11-20> direction.

Next, on the front surface of the n$^+$-type silicon carbide substrate 1, the n$^-$-type silicon carbide layer 2 is formed by epitaxial growth and has a thickness of, for example, 10 μm. The n$^-$-type silicon carbide layer 2 may be doped with an n-type impurity such as nitrogen so that an impurity concentration thereof becomes, for example, $1.0\times10^{16}/cm^3$. By the processes up to here, the silicon carbide base 100 is fabricated in which the n$^-$-type silicon carbide layer 2 is stacked on the front surface of the n$^+$-type silicon carbide substrate 1. Next, by photolithography and ion implantation, the p-type base region 3 of the main semiconductor element 10 is selectively formed in a surface layer of the n$^-$-type silicon carbide layer 2.

Next, processes including photolithography and ion implantation as a set is repeatedly performed with different ion implantation conditions, whereby the n$^+$-type source region 4 and the p$^+$-type contact region 5 are formed. A sequence in which the n$^+$-type source region 4 and the p$^+$-type contact region 5 are formed may be variously changed. In a case in which the silicon carbide base 100 is configured by further stacking a p-type silicon carbide layer constituting the p-type base region 3 on the n$^-$-type silicon carbide layer 2, the n$^+$-type source region 4, the p$^+$-type contact region 5 and the n-type JFET region p-type silicon carbide layer are formed in this p-type silicon carbide layer.

Next, heat treatment (annealing) for activating the regions formed in the silicon carbide base 100 by ion implantation is performed. This activation heat treatment may be performed, for example, at a temperature of about 1620 degrees C. for about 2 minutes. Next, the front surface of the silicon carbide base 100 is subject to thermal oxidation by heat treatment, forming the gate insulating film 6 having, for example, a thickness of about 100 nm. This thermal treatment may be performed, for example, in a mixed gas atmosphere of oxygen ($O_2$) gas and hydrogen ($H_2$) gas at a temperature of about 1000 degrees C. As a result, the front surface of the silicon carbide base 100 overall is covered by the gate insulating film 6.

In the edge termination region 102, the gate insulating film 6 covering the front surface of the silicon carbide base 100 may be used with the thickness thereof as is to be the insulating layer 12, or an insulating film may be deposited to increase the thickness for use as the insulating layer 12. Next, on the gate insulating film 6 and the insulating layer 12, the poly-silicon layer is formed. This poly-silicon layer may be doped with, for example, phosphorus (P) or may be non-doped. Next, the poly-silicon layer is patterned and selectively removed, leaving portions thereof becoming the gate electrode 7 of the main semiconductor element 10 and, the p-type poly-silicon layer 21 and the n-type poly-silicon layer 22 of the temperature sensing part 20.

In a case in which a phosphorus doped poly-silicon layer is deposited on the gate insulating film 6 and the insulating layer 12, of the poly-silicon layer remaining on the insulating layer 12, a portion to constitute the p-type poly-silicon layer 21 may be ion implanted with a p-type impurity, inverting the portion to a p-type. Further, in a case in which a non-doped poly-silicon layer is deposited on the gate insulating film 6 and the insulating layer 12, portions of the poly-silicon layer remaining on the gate insulating film 6 and the insulating layer 12, and respectively corresponding to the gate electrode 7, the p-type poly-silicon layer 21 and the n-type poly-silicon layer 22 are made a predetermined conductivity type by, for example, ion implantation. Next, on the front surface of the silicon carbide base 100 overall, the interlayer insulating film 8 is deposited (formed) to have a thickness of, for example, 1.0 μm and so as to cover the gate electrode 7, the p-type poly-silicon layer 21, and the n-type poly-silicon layer 22. The interlayer insulating film 8 may be formed using, for example, a phosphorus glass (phosphosilicate glass (PSG)) as a material. Next, by photolithography and etching, the interlayer insulating film 8, the gate insulating film 6, and the insulating layer 12 are patterned, forming the first to the fourth contact holes 8a to 8d. Next, by heat treatment (reflow), the interlayer insulating film 8 is planarized.

Next, for example, by a sputtering method, a metal film is formed on the interlayer insulating film 8 so as to be embedded in the first to the fourth contact holes 8a to 8d. In the metal film, for example, aluminum (Al—Si) containing silicon at a rate of 1% may be used as a material. Further, the metal film may have a stacked structure in which plural metal films of differing materials are stacked. Next, by photolithography and etching, the metal film is patterned to remain as the source electrode 9, a gate pad, the anode electrode 23, the cathode electrode 24, and an electrode pad of a circuit part other than that for the temperature sensing part 20.

Next, for example, by a sputtering method, at the rear surface (rear surface of the n$^+$-type silicon carbide substrate 1) of the silicon carbide base 100 for example, a nickel (Ni) film constituting the drain electrode 11 is formed. Next, by heat treatment at a temperature of, for example, about 970 degrees C., an ohmic contact of the drain electrode 11 and the silicon carbide base 100 is formed. Further, when a contact part of the source electrode 9 with the silicon carbide base 100 is constituted by a material facilitating formation of an ohmic contact, the ohmic contact of the source electrode 9 and the silicon carbide base 100 may be formed concurrently with an ohmic contact of the drain electrode 11 and the silicon carbide base 100.

Next, on a surface of the nickel film formed as the drain electrode 11, for example, a titanium (Ti) film, a nickel film and a gold (Au) film are formed in order state, constituting the drain electrode 11. Next, at the front surface of the silicon carbide base 100, a protective film (not depicted) such as a passivation film is formed. Thereafter, the silicon carbide base 100 is cut (diced) into individual chips, whereby the semiconductor device depicted in FIGS. 1 to 3 is completed.

As described, according to the first embodiment, an anode region of the temperature sensing part and a source region of the main semiconductor element are connected by wiring on the front surface of the silicon carbide base, whereby when the main semiconductor element is ON, the drift current flowing through the main semiconductor element is a forward current of a diode constituting the temperature sensing part. In other words, a current source for driving the temperature sensing part may be built into the same silicon carbide base as that of the main semiconductor element. Therefore, provision of an external current source for driving the temperature sensing part becomes unnecessary, enabling the number of external components to be reduced, whereby decreases in reliability of the semiconductor device as a product due to an increased number of external components may be prevented. Therefore, the temperature of the main semiconductor element may be detected with high precision.

Further, according to the first embodiment, in arranging in the same silicon carbide base as the main semiconductor element, the temperature sensing part and current sensing part, which are protection circuits of the main semiconductor element, the temperature sensing part and the current sensing part have common wiring (electrode pad). Therefore, the number of electrode pads may be reduced, enabling cost reductions. Further, according to the first embodiment, the semiconductor device may be configured by only the MOS gate structure part of the main semiconductor element and the diode provided on the same silicon carbide base as the main semiconductor element and thus, has a simple element structure, whereby the reliability may be further improved.

Figure 4:
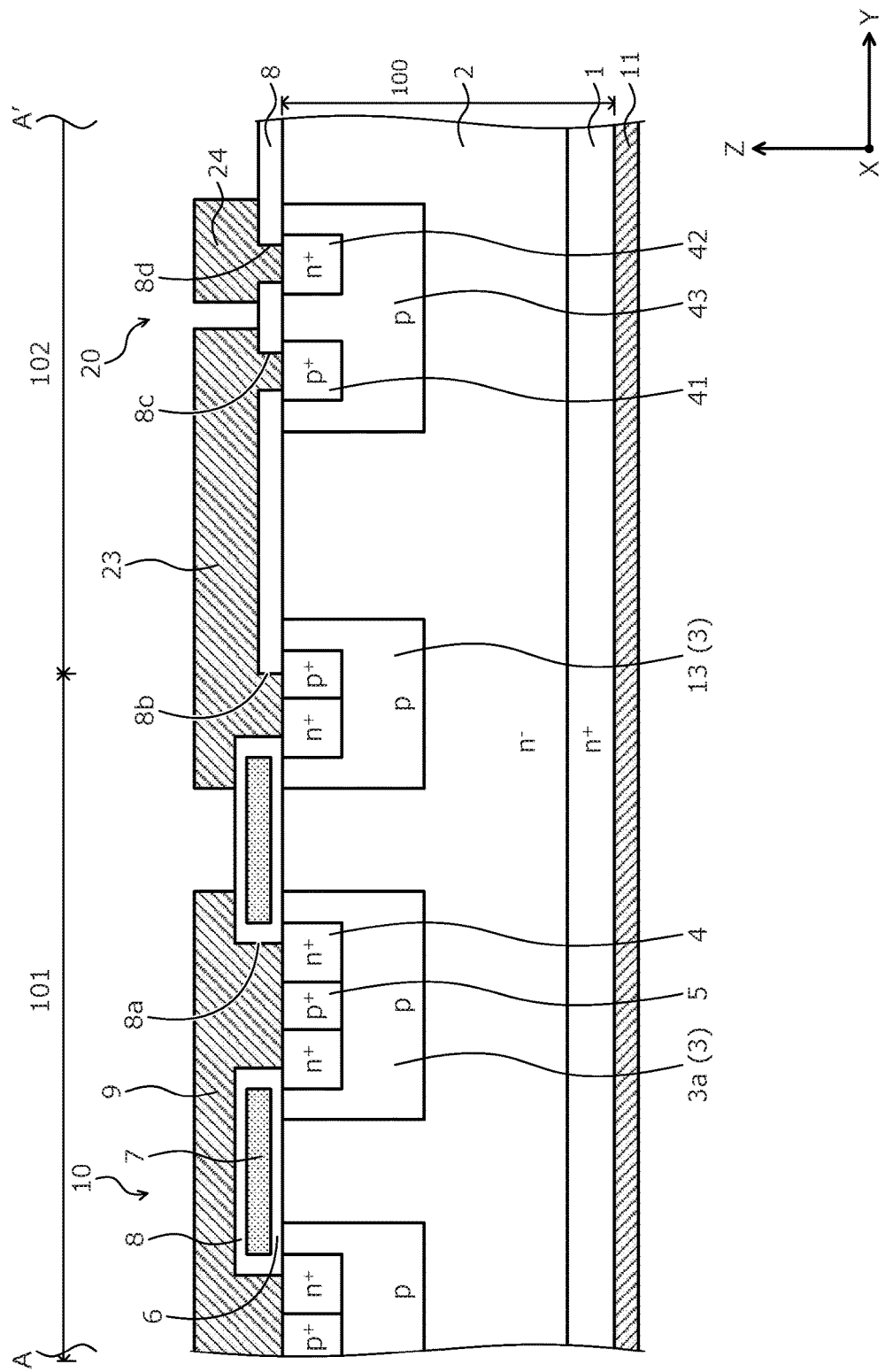
FIG. 4 is a cross-sectional view of a structure of the semiconductor device according to a second embodiment.
Figure 5:
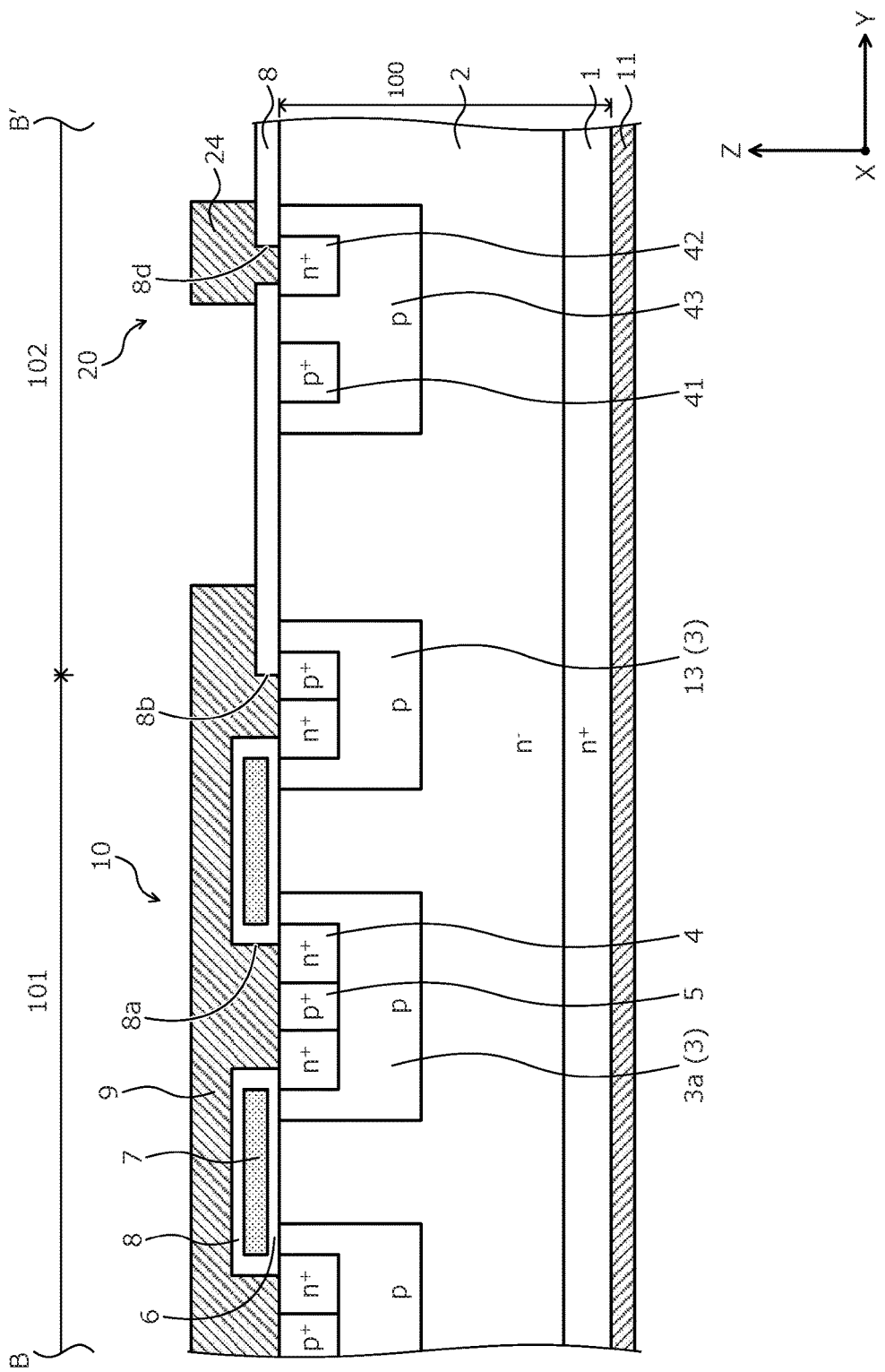
FIG. 5 is a cross-sectional view of the structure of the semiconductor device according to the second embodiment.

A structure of the semiconductor device according to a second embodiment will be described. FIGS. 4 and 5 are cross-sectional views of a structure of the semiconductor device according to the second embodiment. A planar layout of electrode pads of the semiconductor device according to the second embodiment are the same as those in the first embodiment (refer to FIG. 1). FIG. 4 depicts a cross-section structure at cutting line A-A' in FIG. 1. FIG. 5 depicts a cross-section structure at cutting line B-B' in FIG. 1. The semiconductor device according to the second embodiment differs from the semiconductor device according to the first embodiment in that the temperature sensing part 20 is formed by a diffusion region in the silicon carbide base 100.

In particular, the temperature sensing part 20 is a horizontal diode (diffusion diode) formed by a pn junction between an n$^+$-type cathode region 42 and, a p$^+$-type anode region 41 and a p-type base region 43. The p-type base region 43 is selectively formed in a surface layer of the front surface of the silicon carbide base 100, in the edge termination region 102. Further, the p-type base region 43 is arranged further outward than and separated from an outermost p-type base region 13. An outward end of the outermost p-type base region 13, for example, is positioned near the border of the active region 101 and the edge termination region 102.

The p$^+$-type anode region 41 and the n$^+$-type cathode region 42 are each selectively provided in the p-type base region 43, separated from each other. In the edge termination region 102, the front surface of the silicon carbide base 100 is covered by the interlayer insulating film 8 and, the p$^+$-type anode region 41 and the n$^+$-type cathode region 42 are respectively exposed at the third and the fourth contact holes 8c, 8d opened in the interlayer insulating film 8.

The anode electrode 23 is in contact with the p$^+$-type anode region 41, via the third contact hole 8c. Further, similarly to the first embodiment, the anode electrode 23 is in contact with the n$^+$-type source region 4 and the p$^+$-type contact region 5 of at least one unit cell constituting the main semiconductor element 10, via the second contact hole 8b. The cathode electrode 24 is in contact with the n$^+$-type cathode region 42, via the fourth contact hole 8d.

A method of manufacturing the semiconductor device according to the second embodiment includes in the method of manufacturing the semiconductor device according to the first embodiment, forming a diffusion diode constituted by the p-type base region 43, the p$^+$-type anode region 41, and the n$^+$-type cathode region 42, in place of forming the poly-silicon diode. The p-type base region 43, the p$^+$-type anode region 41, and the n$^+$-type cathode region 42, for example, may be each formed concurrently with the formation of the p-type base region 3, the n$^+$-type source region 4, and the p$^+$-type contact region 5 of the main semiconductor element 10.

As described, according to the second embodiment, even when the temperature sensing part is constituted by a diffusion diode, effects similar to those of the first embodiment may be obtained.

Figure 6:
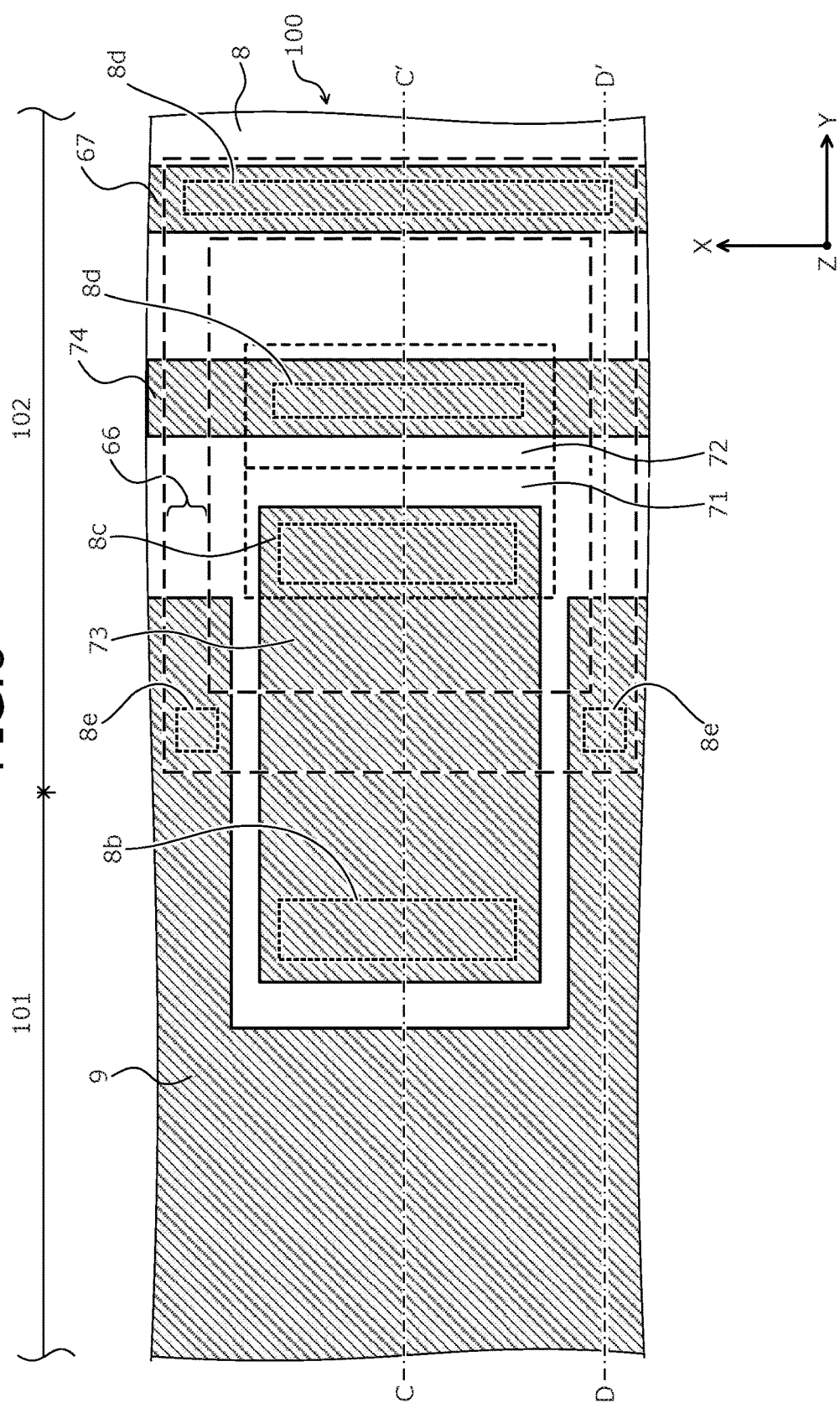
FIG. 6 is a plan view of an example of a planar layout of the semiconductor device according to a third embodiment.
Figure 7:
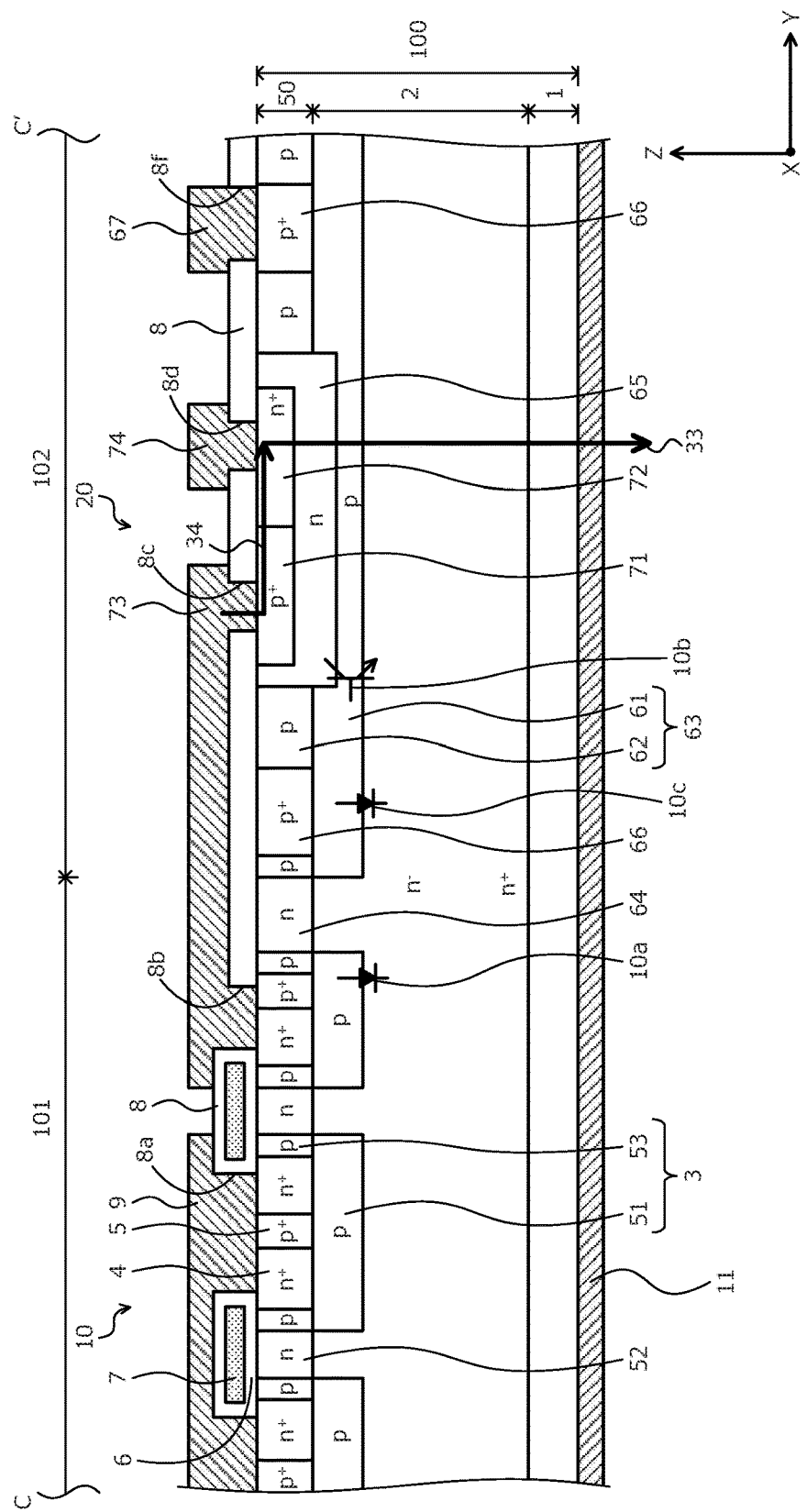
FIG. 7 is a cross-sectional view at cutting line C-C' in FIG. 6.
Figure 8:
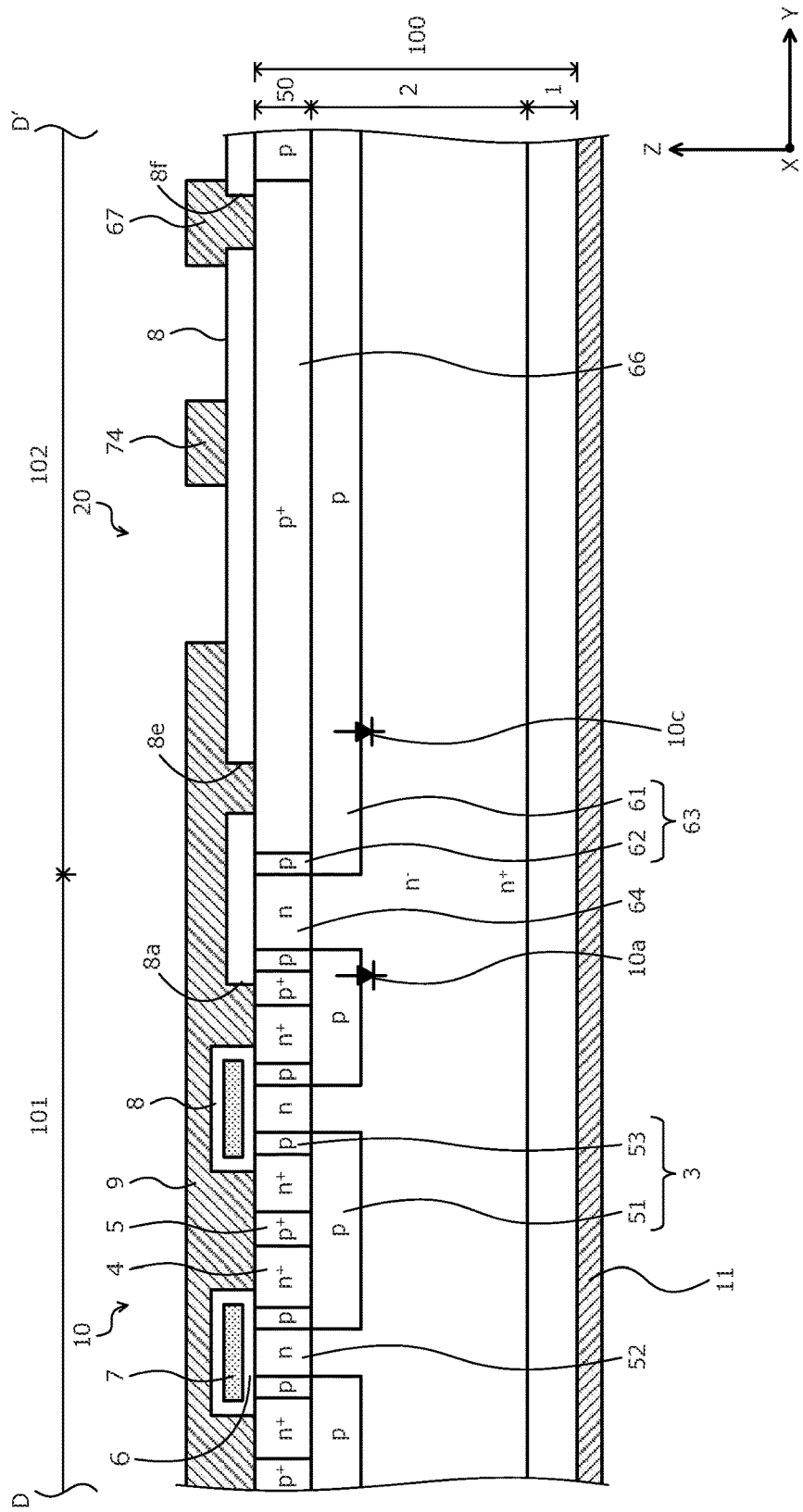
FIG. 8 is a cross-sectional view at cutting line D-D' in FIG. 6.

A structure of the semiconductor device according to a third embodiment will be described. FIG. 6 is a plan view of an example of a planar layout of the semiconductor device according to the third embodiment. FIG. 7 is a cross-sectional view at cutting line C-C' in FIG. 6. FIG. 8 is a cross-sectional view at cutting line D-D' in FIG. 6. In FIG. 6, in addition to planar layouts of the electrode pads, planar layouts of a p$^+$-type contact region 66, a p$^+$-type anode region 71, and an n$^+$-type cathode region 72 described hereinafter are indicated by a dashed line. Planar layouts of the electrode pads (the source electrode 9, an anode electrode 73 and a cathode electrode 74) are similar to those of the first embodiment.

The semiconductor device according to the third embodiment differs from the semiconductor device according to the second embodiment in that a p-type silicon carbide layer 50 is stacked on a surface of the n$^-$-type silicon carbide layer 2 on a side of the n$^-$-type silicon carbide layer 2 opposite that opposing the n$^+$-type silicon carbide substrate 1, and the semiconductor device is constituted by the p-type base region 3 of the main semiconductor element 10 and, the p$^+$-type anode region 71 and the n$^+$-type cathode region 72 of the temperature sensing part 20. In other words, the semiconductor device according to the third embodiment is constituted by the silicon carbide base 100 in which the n$^-$-type silicon carbide layer 2 and the p-type silicon carbide layer 50 are stacked in order stated on the n$^+$-type silicon carbide substrate 1.

In particular, in the active region 101, in a surface layer of the n$^-$-type silicon carbide layer 2 on the side of the n$^-$-type silicon carbide layer 2 opposite that opposing the n$^+$-type silicon carbide substrate 1, a first p-type base region 51 is selectively provided. A portion of the n$^-$-type silicon carbide layer 2 other than the first p-type base region 51 and a third p-type base region 61 described hereinafter is the drift region. On the surface of the n$^-$-type silicon carbide layer 2, on the side of the n$^-$-type silicon carbide layer 2 opposite that opposing the n$^+$-type silicon carbide substrate 1, the p-type silicon carbide layer 50 is provided so as to cover the first p-type base region 51. An impurity concentration of the p-type silicon carbide layer 50 may be lower than an impurity concentration of the first p-type base region 51.

In the p-type silicon carbide layer 50, at a portion opposing the first p-type base region 51 in the depth direction Z, the n$^+$-type source region 4 and the p$^+$-type contact region 5 are each selectively provided. Further, in the p-type silicon carbide layer 50, an n-type JFET region 52 that penetrates the p-type silicon carbide layer 50 in the depth direction Z and reaches the drift region is provided. A portion of the p-type silicon carbide layer 50 other than the n$^+$-type source region 4, the p$^+$-type contact region 5, the n-type JFET region 52, and a fourth p-type base region 62 described hereinafter is a second p-type base region 53. The first and the second p-type base regions 51, 53 correspond to the p-type base region 3 of the second embodiment.

The gate electrode 7, similarly to the second embodiment, is provided on a surface of a portion of the second p-type base region 53 (the p-type base region 3) between the n-type JFET region 52 and the n$^+$-type source region 4, via the gate insulating film 6. A configuration of the source electrode 9 and the drain electrode 11 is similar to that of the second embodiment. In other words, even in a case where the silicon carbide base 100 is used having the n$^-$-type silicon carbide layer 2 and the p-type silicon carbide layer 50 stacked in order state on the n$^+$-type silicon carbide substrate, similarly to the second embodiment, the main semiconductor element 10 is arranged in the active region 101.

In the edge termination region 102, the temperature sensing part 20 is arranged at a p-type base region 63 provided at front surface side of the silicon carbide base 100. In particular, in the edge termination region 102, in the surface layer of the n$^-$-type silicon carbide layer 2 on the side of the n$^-$-type silicon carbide layer 2 opposite that opposing the n$^+$-type silicon carbide substrate 1, the third p-type base region 61 is selectively provided. The third p-type base region 61 is covered by the p-type silicon carbide layer 50 that extends from the active region 101. An n-type region 64 is provided so as to surround a periphery of a portion (hereinafter, fourth p-type base region) 62 of the p-type silicon carbide layer 50 opposing the third p-type base region 61 in the depth direction Z. The n-type region 64 penetrates the p-type silicon carbide layer 50 in the depth direction Z and reaches the drift region.

The third and the fourth p-type base regions 61, 62 are the p-type base region 63 described. The p-type base region 63 is arranged separated from the p-type base region 3 of the main semiconductor element 10. In the p-type base region 63, the p$^+$-type contact region 66 and an n-type isolating region 65 penetrating the fourth p-type base region 62 in the depth direction Z and reaching the third p-type base region 61 are each selectively provided. A depth of the n-type isolating region 65, for example, is deeper than a depth of the fourth p-type base region 62 and shallower than a depth of the p-type base region 63. The p$^+$-type contact region 66 is arranged in, for example, a rectangular frame-shaped planar layout surrounding a periphery of the n-type isolating region 65 (FIG. 6).

The p$^+$-type contact region 66 is in contact with the source electrode 9 of the main semiconductor element 10, via a fifth contact hole 8e. Further, a contact electrode 67 fixed at a source potential of the main semiconductor element 10 may be in contact with the p$^+$-type contact region 66, via a sixth contact hole 8f. The contact electrode 67, at a non-depicted portion, may be electrically connected to the source electrode 9 of the main semiconductor element 10. FIGS. 6 to 8 depict a case in which the source electrode 9 is in contact with the p$^+$-type contact region 66 and the contact electrode 67 of the source potential of the main semiconductor element 10 is provided.

The p$^+$-type contact region 66 is fixed at the source potential of the main semiconductor element 10, whereby at the time of operation of an intrinsic diode 10a of the main semiconductor element 10, positive charge accumulated at the p-type base region 3 of the main semiconductor element 10 may be pulled out. The intrinsic diode 10a of the main semiconductor element 10 is a parasitic diode (body diode) formed at a pn junction between the p-type base region 3 and the drift region (the n$^-$-type silicon carbide layer 2). In a case where the intrinsic diode 10a of the main semiconductor element 10 is not to operate, the p$^+$-type contact region 66 may be used as a floating potential without contacting the source electrode or the contact electrode 67.

In the n-type isolating region 65, the p$^+$-type anode region 71 and the n$^+$-type cathode region 72 are each selectively provided. At a pn junction between the p$^+$-type anode region 71 and the n$^+$-type cathode region 72, the diffusion diode constituting the temperature sensing part 20 is formed. In FIG. 7, although a case in which the n$^+$-type cathode region 72 is arranged further outward than is the p$^+$-type anode region 71, without limitation hereto, arrangement of the p$^+$-type anode region 71 and the n$^+$-type cathode region 72 may be variously changed. The temperature sensing part 20 is electrically isolated from the main semiconductor element 10 by a pn junction between the p-type base region 63 and the n-type isolating region 65.

The anode electrode 73, similarly to the second embodiment, is in contact with the p$^+$-type anode region 71, via the third contact hole 8c. Additionally, similarly to the second embodiment, the anode electrode 73 is in contact with the n$^+$-type source region 4 and the p$^+$-type contact region 5 of at least one unit cell constituting the main semiconductor element 10, via the second contact hole 8b. Similarly to the second embodiment, the cathode electrode 74 is in contact with the n$^+$-type cathode region 72, via the fourth contact hole 8d. Similarly to the first embodiment, the contact electrode 67, the anode electrode 73, and the cathode electrode 74 are electrode pads arranged on the front surface of the silicon carbide base 100.

As described, the p$^+$-type anode region 71 of the temperature sensing part 20 is electrically connected to the n$^+$-type source region 4 and the p$^+$-type contact region 5 of the main semiconductor element 10, whereby, similarly to the first embodiment, when the main semiconductor element 10 is ON, the temperature sensing part 20 may be forward biased and energized. Operation of the temperature sensing part 20 when the main semiconductor element 10 is ON is similar to that of the first embodiment. Further, when voltage that is positive with respect to the drain electrode 11 of the main semiconductor element 10 is applied to the source electrode 9 and the intrinsic diode 10a of the main semiconductor element 10 is forward biased and energized (operates), the temperature sensing part 20 operates as follows.

When the intrinsic diode 10a of the main semiconductor element 10 is energized, a parasitic diode 10c formed by a pn junction between the p-type base region 63 fixed at the source potential of the main semiconductor element 10 and the n$^-$-type silicon carbide layer 2 is also forward biased and energized. Carrier mobility due to forward biasing of the parasitic diode 10c becomes base current of a parasitic npn bipolar transistor 10b of the edge termination region 102. Therefore, a current 33 flows along a path of the n$^+$-type cathode region 72, the n-type isolating region 65, the p-type base region 63, the drift region, and the n$^+$-type silicon carbide substrate 1, turning ON the parasitic npn bipolar transistor 10b. The parasitic npn bipolar transistor 10b is a parasitic element from the n$^+$-type cathode region 72, the n-type isolating region 65, the p-type base region 63, and the drift region (the n$^-$-type silicon carbide layer 2).

In other words, the parasitic npn bipolar transistor 10b is voltage driven by a voltage between the source and drain of the main semiconductor element 10. Further, the current 33 flowing through the parasitic npn bipolar transistor 10b is a forward current 34 of the temperature sensing part 20. Therefore, the currents 34, 33 flow along a path of the p-type base region 3, the n$^+$-type source region 4, the anode electrode 73, the p$^+$-type anode region 71, the n$^+$-type cathode region 72, and the parasitic npn bipolar transistor 10b; and positive charge (holes) accumulated at the p-type base region 3 of the main semiconductor element 10 is pulled out. As a result, degradation of the intrinsic diode 10a of the main semiconductor element 10 may be prevented.

As described, according to the third embodiment, effects similar to those of the first and the second embodiments may be obtained. According to the third embodiment, the intrinsic diode 10a of the main semiconductor element 10, for example, may be used as a protection diode for changing flow of a current (load current) flowing through an inductive load of a motor, etc. in an inverter.

Figure 9:
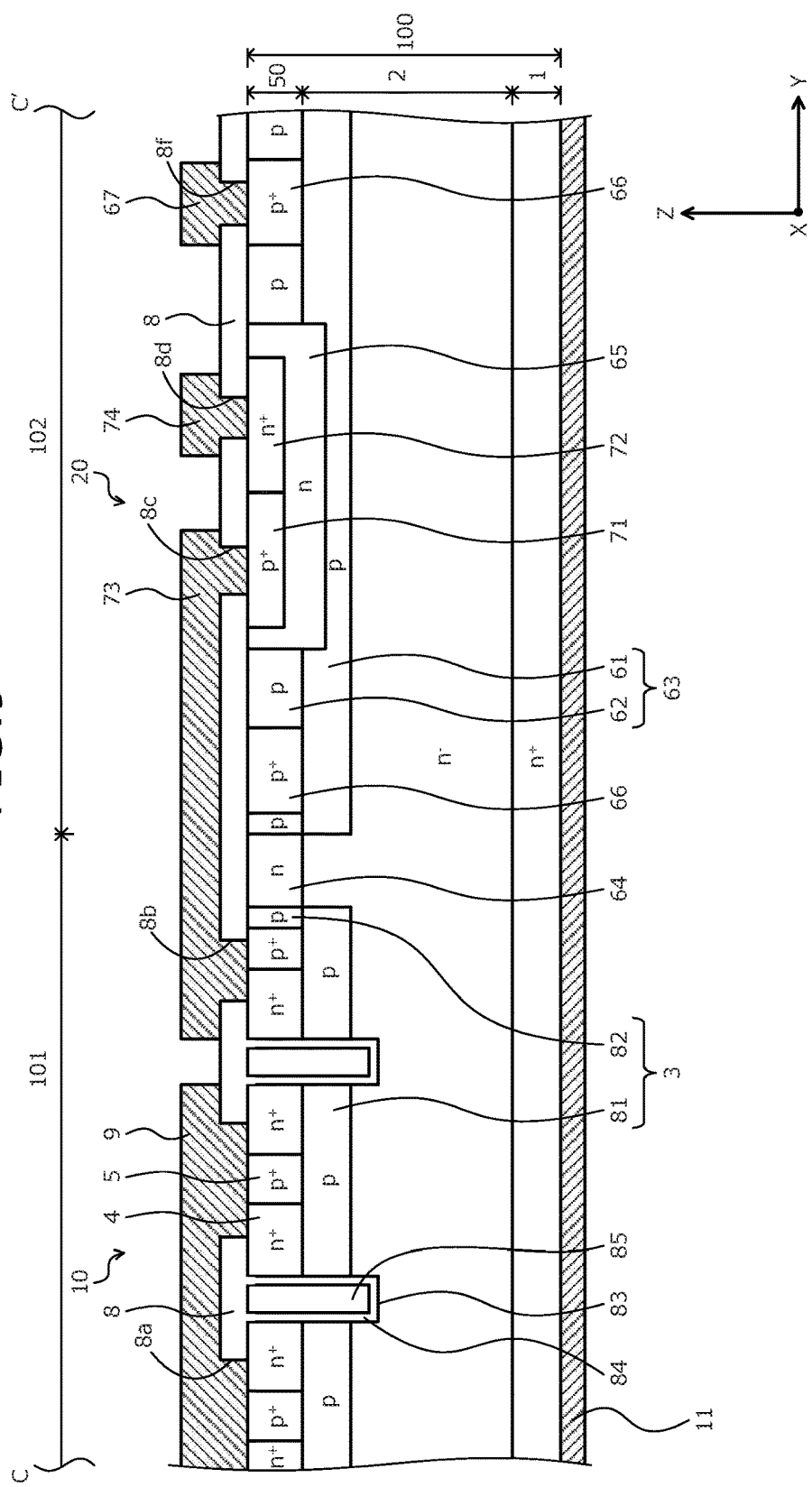
FIG. 9 is a cross-sectional view of a structure of the semiconductor device according to a fourth embodiment.

A structure of the semiconductor device according to a fourth embodiment will be described. FIG. 9 is a cross-sectional view of a structure of the semiconductor device according to the fourth embodiment. Planar layouts of the electrode pads of the semiconductor device according to the fourth embodiment are similar to those of the third embodiment (refer to FIG. 6). FIG. 9 depicts a cross-section structure at cutting line C-C' in FIG. 6. A cross-section structure (not depicted) at cutting line D-D' in FIG. 6 is a configuration of the active region 101 of FIG. 8 replaced with the active region 101 of FIG. 9.

The semiconductor device according to the fourth embodiment differs from the semiconductor device according to the third embodiment in that the MOS gate structure part of the main semiconductor element 10 is a trench gate structure. A configuration of the edge termination region 102 is similar to that of the third embodiment. Hereinafter, portions of the MOS gate structure part of the main semiconductor element 10 differing from the third embodiment will be described.

In the active region 101, a first p-type base region 81 is provided substantially uniformly in a surface of the n⁻-type silicon carbide layer 2, on a side of the n⁻-type silicon carbide layer 2 opposite that of the n⁻-type silicon carbide layer 2 opposing the n⁺-type silicon carbide substrate 1. A trench 83 penetrating the p-type silicon carbide layer 50 and the first p-type base region 81, and reaching the drift region is provided. In the trench 83, a gate electrode 85 is provided, via a gate insulating film 84. Between adjacent trenches 83 (mesa part), the n⁺-type source region 4 and the p⁺-type contact region 5 are selectively provided.

The n⁺-type source region 4 opposes the gate electrode 85, across the gate insulating film 84 of a side wall of the trench 83. A portion of the p-type silicon carbide layer 50 other than the n⁺-type source region 4 and the p⁺-type contact region 5 is a second p-type base region 82. The first and the second p-type base regions 81, 82 correspond to the p-type base region 3 of the second embodiment. The trench gate structure is constituted by the p-type base region 3, the n⁺-type source region 4, the p⁺-type contact region 5, the trench 83, the gate insulating film 84, and the gate electrode 85.

As described, according to the fourth embodiment, in a case where the main semiconductor element is a vertical MOSFET of a trench gate structure, effects similar to those of the first to third embodiments may be obtained.

Figure 10:
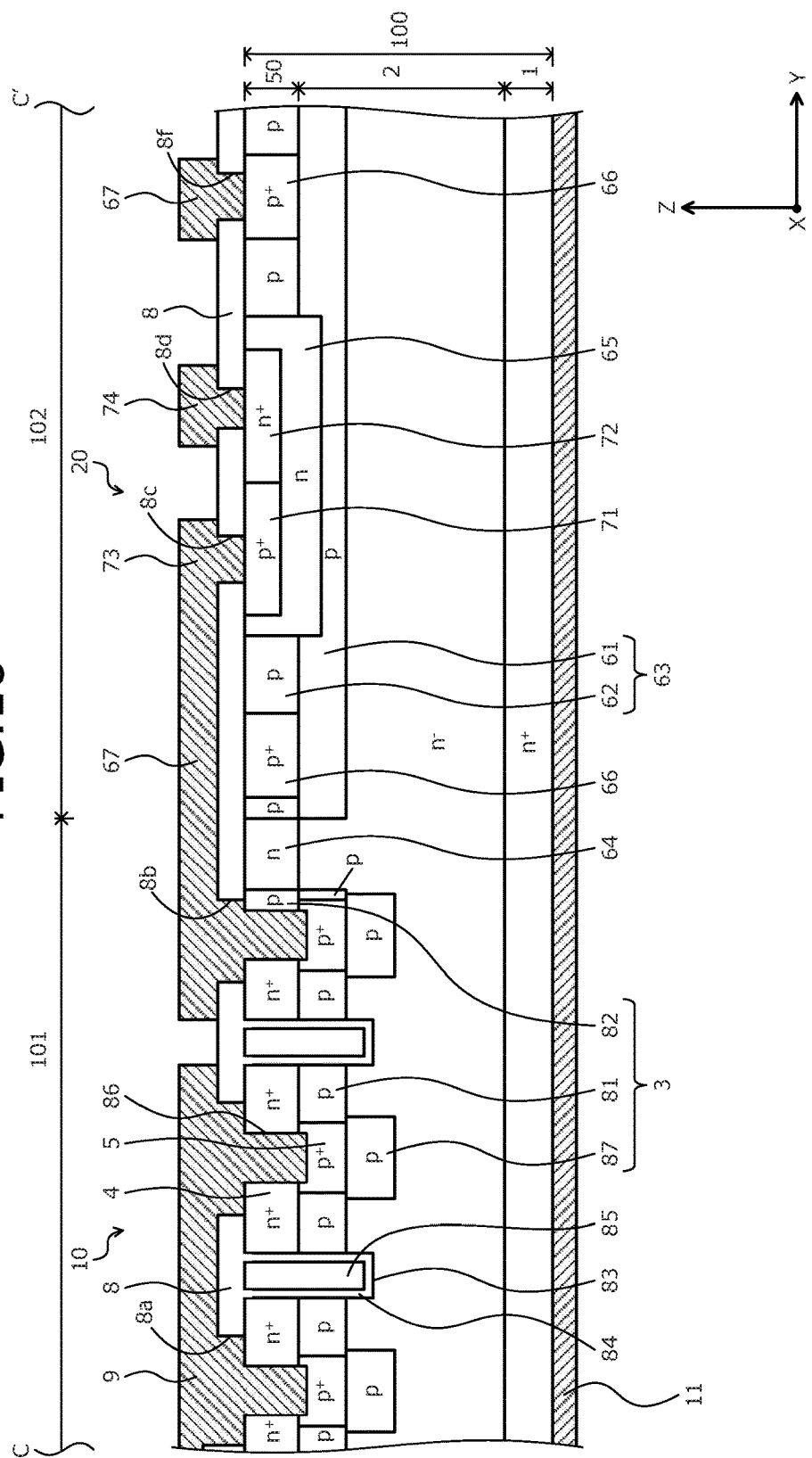
FIG. 10 is a cross-sectional view of a structure of the semiconductor device according to a fifth embodiment.

A structure of the semiconductor device according to the fifth embodiment will be described. FIG. 10 is a cross-sectional view of a structure of the semiconductor device according to the fifth embodiment. Planar layouts of the electrode pads of the semiconductor device according to the fifth embodiment are similar to those of the third embodiment (refer to FIG. 6). FIG. 10 depicts a cross-section structure at cutting line C-C' of FIG. 6. A cross-section structure (not depicted) at cutting line D-D' of FIG. 6 is a configuration of the active region 101 of FIG. 8 replaced with the active region 101 of FIG. 10.

The semiconductor device according to the fifth embodiment differs from the semiconductor device according to the fourth embodiment in that between adjacent trenches (hereinafter, gate trenches) 83, a contact trench 86 is provided. The contact trench 86 is a trench in which the source electrode 9 is embedded. A contact is formed by semiconductor regions exposed at an inner wall of the contact trench 86 and the source electrode 9. Hereinafter, portions of the MOS gate structure part of the main semiconductor element 10 differing from the fourth embodiment will be described.

The contact trench 86 penetrates the p-type silicon carbide layer 50 in the depth direction Z and reaches the first p-type base region 81. The n⁺-type source region 4 is provided between the gate trench 83 and the contact trench 86. The n⁺-type source region 4 opposes the gate electrode 85, across the gate insulating film 84 of a side wall of the gate trench 83 and is in contact with the source electrode 9, at a side wall of the contact trench 86. The p⁺-type contact region 5 is selectively provided in the first p-type base region 81.

Further, the p⁺-type contact region 5 penetrates the first p-type base region 81 in the depth direction Z and reaches the drift region. The p⁺-type contact region 5 is in contact with the source electrode 9, at a bottom of the contact trench 86. Between adjacent gate trenches 83, a fifth p-type base region 87 is provided in the drift region, at a position deeper than the p⁺-type contact region 5. An end that is deepest of the fifth p-type base region 87, for example, is positioned deeper than the bottom of the gate trench 83.

As described, according to the fifth embodiment, even when a source electrode and a contact trench are provided in the main semiconductor element of a trench gate structure, effects similar to those of the first to the fourth embodiments may be obtained.

The present invention, without limitation to the embodiments, may be variously modified within a range not departing from the spirit of the invention. For example, in the embodiments, although the anode region and cathode region of the temperature sensing part are arranged along the first direction, the anode region and the cathode region of the temperature sensing part may be arranged along the second direction. Further, dimensions, impurity concentrations, etc. of regions are variously set according to necessary specifications. Further, the present invention achieves similar effects in a semiconductor device that uses a different wide bandgap semiconductor material such as gallium nitride (GaN), a semiconductor device that uses silicon, etc. In the embodiments, while a first conductivity type is assumed to be an n-type and a second conductivity type is assumed to be a p-type, the present invention is similarly implemented when the first conductivity type is a p-type and the second conductivity type is an n-type.

As described, drift current that flows in the semiconductor element when the semiconductor element is ON becomes forward current of the diode constituting the temperature sensing part. Therefore, an external current source for energizing the temperature sensing part need not be provided, enabling the number of external components to be reduced, whereby decreases in reliability of the semiconductor device as a product occurring due to increases in the number of external components may be prevented.

The semiconductor device according to the embodiments of the present invention is a semiconductor device having on a same semiconductor substrate as a main semiconductor element, a structure for detecting the temperature of the main semiconductor element and achieves an effect in that a semiconductor device having high reliability may be provided.

As described, the semiconductor device according to the embodiments of the present invention is useful for a semiconductor device used as a switching device and is particularly suitable for a semiconductor device that uses silicon carbide.

In the present specification and claims, different regions of a semiconductor device having different conductivity types are described as being "provided" and "selectively provided" in other regions having other conductivity types. In the present specification and claims, referring to one region of one conductivity type as being "provided in" a second region of a second conductivity type means that during a formation process, certain portions of the second region are altered to have different conductivity types than other portions. It is not to be understood as one material having two conductivity types in the same place at the same time. In other words, the portion of the second region having the first region provided therein no longer has the second conductivity type. The feature of different regions being formed and existing at different places within a semiconductor substrate is clearly shown in the Figures provided herewith.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor element having:
   a first semiconductor layer of a first conductivity type, the first semiconductor layer being a portion of a front surface side of a semiconductor substrate of the first conductivity type;
   a first semiconductor region of a second conductivity type provided selectively in the first semiconductor layer;
   a second semiconductor region of the first conductivity type provided selectively in the first semiconductor region;
   a gate insulating film provided in contact with a region of the first semiconductor region between the first semiconductor layer and the second semiconductor region;
   a gate electrode provided opposing the first semiconductor region, across the gate insulating film;
   a first electrode layer electrically connected to the first semiconductor region and the second semiconductor region;
   a second semiconductor layer of the first conductivity type, the second semiconductor layer being a portion of a rear side of the semiconductor substrate, in contact with the first semiconductor layer, the second semiconductor layer having an impurity concentration that is higher than an impurity concentration of the first semiconductor layer; and
   a second electrode layer in contact with the second semiconductor layer; and
a diode arranged in the semiconductor substrate, the diode detecting a temperature of the semiconductor element by passing current through the diode based on the semiconductor substrate having a predetermined temperature, the diode including an anode region and a third electrode layer, wherein
the anode region of the diode is electrically connected to the first semiconductor region and the second semiconductor region via the third electrode layer the third electrode layer being arranged on a front surface of the semiconductor substrate and not connected to the first electrode layer.

2. The semiconductor device according to claim 1, wherein
the diode has:
   a poly-silicon layer of the second conductivity type provided on the front surface of the semiconductor substrate, the poly-silicon layer of the second conductivity type constituting the anode region;
   a poly-silicon layer of the first conductivity type provided on the front surface of the semiconductor substrate, in contact with the poly-silicon layer of the second conductivity type;
   the third electrode layer in contact with the first semiconductor region, the second semiconductor region, and the poly-silicon layer of the second conductivity type; and
   a fourth electrode layer in contact with the poly-silicon layer of the first conductivity type.

3. The semiconductor device according to claim 1, wherein
the diode has:
   a third semiconductor region of the second conductivity type provided selectively in the first semiconductor layer;
   a fourth semiconductor region of the second conductivity type provided selectively in the third semiconductor region and constituting the anode region, the fourth semiconductor region having an impurity concentration that is higher than an impurity concentration of the third semiconductor region;
   a fifth semiconductor region of the first conductivity type provided selectively in the third semiconductor region;
   the third electrode layer in contact with the first semiconductor region, the second semiconductor region, and the fourth semiconductor region; and
   a fourth electrode layer in contact with the fifth semiconductor region.

4. The semiconductor device according to claim 3, further comprising
a sixth semiconductor region of the first conductivity type provided between the third semiconductor region and, the fourth semiconductor region and the fifth semiconductor region, the sixth semiconductor region having an impurity concentration that is lower than an impurity concentration of the fifth semiconductor region, wherein
the third semiconductor region is fixed at a same potential as a potential of the first electrode layer.

5. The semiconductor device according to claim 4, wherein
the sixth semiconductor region, the third semiconductor region and the first semiconductor layer constitute a parasitic npn bipolar transistor, the parasitic npn bipolar transistor being voltage driven by a voltage applied between the first electrode layer and the second electrode layer of the semiconductor element.

6. The semiconductor device according to claim 1, wherein the diode is voltage driven by a gate threshold voltage of the semiconductor element.

7. The semiconductor device according to claim 1, wherein
the semiconductor substrate contains a semiconductor material having a bandgap wider than a bandgap of silicon.

8. The semiconductor device according to claim 7, wherein
the semiconductor material having a bandgap wider than a bandgap of silicon is silicon carbide.

* * * * *